United States Patent
Moore

(10) Patent No.: US 11,728,621 B2
(45) Date of Patent: Aug. 15, 2023

(54) VOLTAGE CONTROLLED STEERED VCSEL DRIVER

(71) Applicant: STMicroelectronics (Research & Development) Limited, Marlow (GB)

(72) Inventor: John Kevin Moore, Edinburgh (GB)

(73) Assignee: STMicroelectronics (Research & Development) Limited, Marlow (GB)

(*) Notice: Subject to any disclaimer, the term of this patent is extended or adjusted under 35 U.S.C. 154(b) by 386 days.

(21) Appl. No.: 16/891,936

(22) Filed: Jun. 3, 2020

(65) Prior Publication Data

US 2020/0388987 A1     Dec. 10, 2020

Related U.S. Application Data

(60) Provisional application No. 62/857,710, filed on Jun. 5, 2019.

(51) Int. Cl.
    *H01S 5/042*      (2006.01)
    *H01S 5/068*      (2006.01)
    *H01S 5/42*      (2006.01)

(52) U.S. Cl.
    CPC ........ *H01S 5/0427* (2013.01); *H01S 5/06808* (2013.01); *H01S 5/423* (2013.01)

(58) Field of Classification Search
    CPC ......... H01S 5/40–426; H01S 5/42–426; H01S 5/06243; H01S 5/06808;

(Continued)

(56) References Cited

U.S. PATENT DOCUMENTS

| | | | | |
|---|---|---|---|---|
| 6,087,811 A | * | 7/2000 | Crawford | H05B 41/34 |
| | | | | 320/137 |
| 6,246,708 B1 | * | 6/2001 | Thornton | H01S 5/423 |
| | | | | 372/96 |

(Continued)

FOREIGN PATENT DOCUMENTS

| | | | | |
|---|---|---|---|---|
| CN | 112234432 A | * | 1/2021 | G01S 17/10 |
| DE | 19912463 A1 | * | 9/2000 | H01S 5/06808 |

(Continued)

OTHER PUBLICATIONS

"Advanced driver assistance systems," First Sensor Mobility, found at https://www.first-sensor.com/en/applications/mobility/advanced-driver-assistance-systems/ (2019) (5 pages).

(Continued)

*Primary Examiner* — Joshua King
(74) *Attorney, Agent, or Firm* — Crowe & Dunlevy

(57) ABSTRACT

An electronic device includes laser emitters, and a laser driver generating a laser drive signal for the laser emitters based upon a feedback control signal. A steering circuit selectively steers the laser drive signal to a different selected one of the plurality of laser emitters and prevents the laser drive signal from being steered to non-selected ones of the plurality of laser emitters, during each of a plurality of time periods. Control circuitry senses a magnitude of a current of the laser drive signal and generates the feedback control signal based thereupon. The feedback control signal is generated so as to cause the laser driver to generate the laser drive signal as having a current with a substantially constant magnitude.

35 Claims, 8 Drawing Sheets

(58) Field of Classification Search
CPC .... H01S 5/0683–0687; H01S 5/06233–06246; H01S 5/042–0428; H05B 45/24; H05B 45/44–48
See application file for complete search history.

(56) References Cited

U.S. PATENT DOCUMENTS

| | | | | |
|---|---|---|---|---|
| 6,252,893 | B1* | 6/2001 | Stange | H04B 10/564 372/38.07 |
| 6,262,540 | B1* | 7/2001 | Seko | H01L 27/156 345/55 |
| 6,389,050 | B2 | 5/2002 | Stronczer | |
| 6,526,076 | B2 | 2/2003 | Cham et al. | |
| 6,563,848 | B1* | 5/2003 | Iwazaki | H01S 5/042 347/237 |
| 6,822,987 | B2 | 11/2004 | Diaz et al. | |
| 6,947,456 | B2 | 9/2005 | Chin et al. | |
| 7,006,543 | B2 | 2/2006 | Self et al. | |
| 7,009,370 | B2* | 3/2006 | Deaton | H02M 3/1584 323/272 |
| 8,368,876 | B1 | 2/2013 | Johnson et al. | |
| 8,837,539 | B1* | 9/2014 | Sun | H01S 5/06808 372/38.07 |
| 8,933,979 | B2* | 1/2015 | Seki | B41J 2/471 347/144 |
| 9,161,019 | B2 | 10/2015 | Millett | |
| 9,516,244 | B2 | 12/2016 | Borowski | |
| 9,667,022 | B1* | 5/2017 | Burkholder | H01S 3/0941 |
| 9,780,527 | B1* | 10/2017 | Lee | H01S 5/06825 |
| 9,876,328 | B1* | 1/2018 | Wappis | H05B 45/10 |
| 10,067,224 | B2 | 9/2018 | Moore et al. | |
| 10,203,366 | B2 | 2/2019 | Burlak et al. | |
| 10,250,011 | B2* | 4/2019 | Van Der Tempel | G01S 7/484 |
| 10,264,653 | B2 | 4/2019 | Moore | |
| 10,359,507 | B2 | 7/2019 | Berger et al. | |
| 10,571,568 | B2 | 2/2020 | Iida et al. | |
| 10,591,600 | B2 | 3/2020 | Villeneuve et al. | |
| 10,663,595 | B2 | 5/2020 | Curatu | |
| 10,942,257 | B2 | 3/2021 | Bao et al. | |
| 2001/0028665 | A1 | 10/2001 | Stronczer | |
| 2002/0064193 | A1 | 5/2002 | Diaz et al. | |
| 2002/0075911 | A1 | 6/2002 | Cham et al. | |
| 2002/0105982 | A1 | 8/2002 | Chin et al. | |
| 2002/0122308 | A1* | 9/2002 | Ikeda | H01S 5/0427 362/259 |
| 2003/0025972 | A1 | 2/2003 | During et al. | |
| 2003/0039280 | A1* | 2/2003 | Mangano | H01S 5/0428 372/38.02 |
| 2003/0205949 | A1* | 11/2003 | Rueger | F02D 41/221 310/316.03 |
| 2004/0212867 | A1 | 10/2004 | Self et al. | |
| 2005/0276294 | A1* | 12/2005 | Crawford | H05B 45/3725 372/38.07 |
| 2006/0133435 | A1* | 6/2006 | Ikeda | B41J 2/473 372/38.03 |
| 2007/0274355 | A1* | 11/2007 | Hattori | H01S 5/06804 372/38.02 |
| 2008/0253418 | A1* | 10/2008 | Egawa | H04N 9/3129 372/38.02 |
| 2009/0034566 | A1* | 2/2009 | Noda | H01S 5/04256 372/41 |
| 2010/0128247 | A1 | 5/2010 | Heizmann et al. | |
| 2010/0142336 | A1* | 6/2010 | Ishibashi | G11B 7/1263 372/38.07 |
| 2010/0244737 | A1* | 9/2010 | Madhani | G01S 7/4814 315/307 |
| 2012/0033692 | A1* | 2/2012 | Schleuning | H01S 5/041 372/75 |
| 2013/0154494 | A1* | 6/2013 | Hoogzaad | H05B 45/44 315/210 |
| 2013/0300838 | A1 | 11/2013 | Borowski | |
| 2014/0071234 | A1 | 3/2014 | Millett | |
| 2014/0211192 | A1* | 7/2014 | Grootjans | H02M 7/42 356/5.01 |
| 2014/0312233 | A1* | 10/2014 | Mark | H05B 45/10 250/341.8 |
| 2015/0053163 | A1* | 2/2015 | Bolz | F02P 23/04 372/38.03 |
| 2015/0078409 | A1* | 3/2015 | Sugihara | H01S 5/0604 372/22 |
| 2015/0130903 | A1* | 5/2015 | Thompson | H01S 5/042 372/38.07 |
| 2016/0233643 | A1* | 8/2016 | Fujimoto | B41J 11/00212 |
| 2017/0070029 | A1* | 3/2017 | Moeneclaey | H01S 5/183 |
| 2017/0115381 | A1 | 4/2017 | Moore et al. | |
| 2017/0153319 | A1 | 6/2017 | Villeneuve et al. | |
| 2017/0365979 | A1* | 12/2017 | Van Der Tempel | H02M 3/158 |
| 2018/0003762 | A1 | 1/2018 | Burlak et al. | |
| 2018/0058924 | A1 | 3/2018 | Storm et al. | |
| 2018/0103528 | A1 | 4/2018 | Moore | |
| 2018/0106903 | A1 | 4/2018 | Iida et al. | |
| 2018/0183209 | A1* | 6/2018 | Nerheim | H01S 5/042 |
| 2018/0188355 | A1 | 7/2018 | Bao et al. | |
| 2018/0188360 | A1* | 7/2018 | Berger | G01S 17/06 |
| 2018/0188361 | A1 | 7/2018 | Berger et al. | |
| 2018/0284285 | A1 | 10/2018 | Curatu | |
| 2018/0301872 | A1* | 10/2018 | Burroughs | F21V 5/041 |
| 2018/0301874 | A1* | 10/2018 | Burroughs | F21V 5/045 |
| 2018/0301875 | A1* | 10/2018 | Burroughs | H01S 5/0428 |
| 2019/0097395 | A1* | 3/2019 | Uno | H01S 5/06825 |
| 2019/0207364 | A1* | 7/2019 | Song | H01S 5/042 |
| 2019/0230304 | A1 | 7/2019 | Moore et al. | |
| 2019/0334316 | A1* | 10/2019 | Kondo | H01S 5/068 |
| 2020/0011732 | A1 | 1/2020 | Dutton et al. | |
| 2020/0173846 | A1 | 6/2020 | Moore | |
| 2020/0178361 | A1* | 6/2020 | Oka | G01S 7/4815 |
| 2021/0302550 | A1 | 9/2021 | Dutton et al. | |

FOREIGN PATENT DOCUMENTS

| | | | | |
|---|---|---|---|---|
| DE | 102011011875 B3 * | 7/2012 | | G01S 17/10 |
| EP | 2189804 A1 | 5/2010 | | |
| GB | 2537505 B | 10/2017 | | |
| WO | WO-2017154128 A1 * | 9/2017 | | H01S 5/0021 |
| WO | 2018196001 A1 | 11/2018 | | |
| WO | WO-2019083750 A1 * | 5/2019 | | G02B 27/01 |
| WO | WO-2020126575 A1 * | 6/2020 | | G01R 19/04 |

OTHER PUBLICATIONS

"Cepton LiDAR Goes Anti-MEMS Route," EEJournal, Jul. 31, 2018 (8 pages).

* cited by examiner

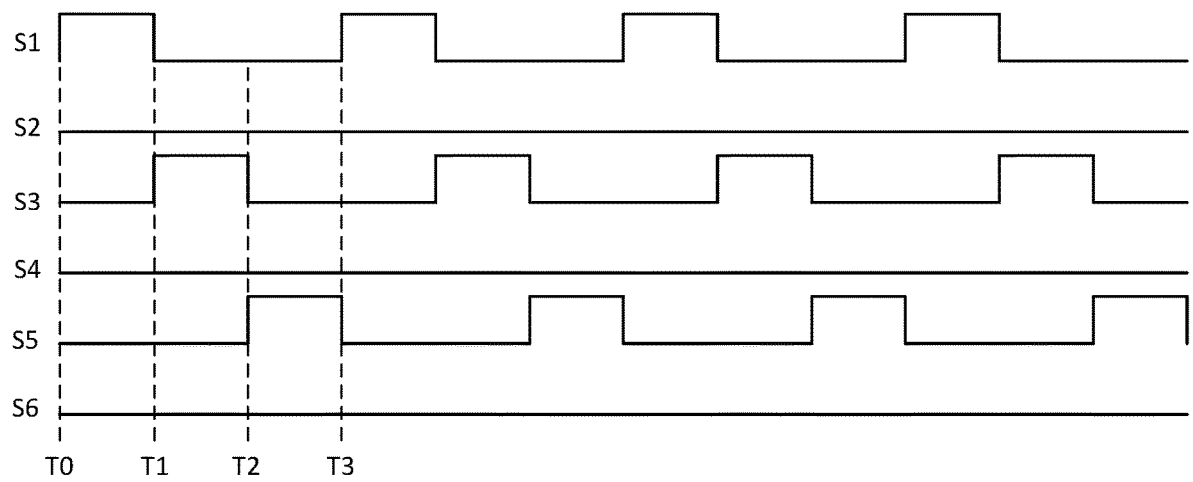
FIG. 5A  Phase 1
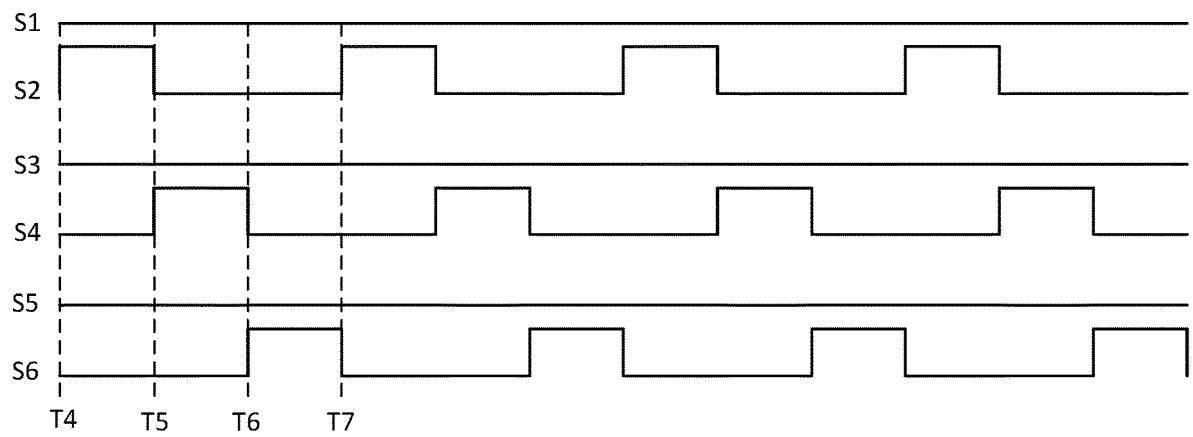
FIG. 5B  Phase 2

VOLTAGE CONTROLLED STEERED VCSEL DRIVER

RELATED APPLICATION

This disclosure claims priority to U.S. Provisional Application for Patent No. 62/857,710, filed Jun. 5, 2019, the contents of which are incorporated by reference in their entirety to the maximum extent allowable under the law.

TECHNICAL FIELD

This application is directed to the field of laser drivers and, in particular, to a steerable voltage controlled laser driver for vertical-cavity surface-emitting laser (VCSEL) diode arrays.

BACKGROUND

A typical laser driver 1, such as for a vertical-cavity surface-emitting laser (VCSEL) diode 2, is shown in FIG. 1. The laser driver 1 includes a switch S and a current source transistor T. In particular, a VCSEL diode 2 has its anode selectively coupled to a supply voltage (VCC) through the switch S, and has its cathode coupled to a drain of the current source transistor T.

For proper operation, it is desired for the current source transistor T to remain in saturation. In order to maintain the current source transistor T in saturation, a minimum voltage drop across the current source transistor T has to be maintained. However, a voltage drop in the laser driver 1 across any component other than the VCSEL diode 2 consumes power, decreasing efficiency and decreasing the power provided to the VCSEL diode 2. An issue with the laser driver 1 is therefore the use of a fixed supply voltage VCC, which can result in a voltage drop across the current source transistor T that exceeds the minimum voltage drop, and corresponding increased power consumption by the current source transistor T and decreased efficiency.

Another issue with the laser driver 1 is that it is ill suited for use in automotive applications, such as Light Detection and Ranging (LIDAR), where multiple VCSEL diodes are to be driven by the same laser driver 1.

Accordingly, further development in the area of laser drivers is needed.

SUMMARY

An electronic device disclosed herein includes a plurality of laser emitters, a laser driver configured to generate a laser drive signal based upon a feedback control signal, and a steering circuit. The steering circuit is configured to selectively steer the laser drive signal to a different selected one of the plurality of laser emitters and prevent the laser drive signal from being steered to non-selected ones of the plurality of laser emitters, during each of a plurality of time periods. The electronic device also includes control circuitry configured to sense a magnitude of a current of the laser drive signal and to generate the feedback control signal based thereupon, the feedback control signal being generated so as to cause the laser driver to generate the laser drive signal as having a current with a substantially constant magnitude.

The plurality of laser emitters may be carried within the electronic device such that each of the plurality of laser emitters has a different field of view, and the steering circuit may select ones of the plurality of laser emitters that do not have immediately adjacent fields of view during successive time periods.

The plurality of laser emitters may be coupled between the steering circuit and ground. The control circuitry may include a sense resistance coupled between the laser driver and steering circuit, and a current sensing circuit configured to generate and adjust the laser drive signal as a function of a sense voltage formed across the sense resistance when the laser drive signal flows through the sense resistance.

The current sensing circuit may be configured to compare the sense voltage to a reference voltage and to generate and adjust the laser drive signal based upon the comparison.

The steering circuit may include a first plurality of switches, with each switch of the first plurality thereof being coupled between an input terminal of a different one of the plurality of laser emitters and a first node. Each of the plurality of laser emitters may have an output terminal coupled to ground.

The steering circuit may include a second plurality of switches, with each switch of the second plurality thereof being coupled between the input terminal and the output terminal of a different one of the plurality of laser emitters. The first plurality of switches and second plurality of switches may be operated so that a switch of the first plurality of switches coupled to an input terminal of a currently selected one of the plurality of laser emitters is closed while the currently selected one of the plurality of laser emitters is selected and so that a switch of the second plurality of switches coupled between an input terminal and output terminal of the currently selected one of the plurality of laser emitters is opened while the currently selected one of the plurality of laser emitters is selected. The first plurality of switches and second plurality of switches may be operated so that switches of the first plurality of switches coupled to input terminals of non-selected ones of the plurality of laser emitters are opened while the non-selected ones of the plurality of laser emitters remain non-selected, and so that switches of the second plurality of switches coupled to the input terminals and to output terminals of the non-selected ones of the plurality of laser emitters are closed while the non-selected ones of the plurality of laser emitters remain non-selected.

The sense resistance may be a sense resistor.

The plurality of laser emitters may be coupled between the steering circuit and the control circuitry. The control circuitry may include a sense resistance coupled between the plurality of laser emitters and ground, and a current sensing circuit configured to generate and adjust the laser drive signal as a function of a sense voltage formed across the sense resistance when the laser drive signal flows through a currently selected one of the plurality of laser emitters and through the sense resistance.

The current sensing circuit may be configured to compare the sense voltage to a reference voltage and to generate and adjust the laser drive signal based upon the comparison.

The steering circuit may include a first plurality of switches, with each switch of the first plurality thereof being coupled between an input terminal of a different one of the plurality of laser emitters and a second node. Each of the plurality of laser emitters may have an output terminal coupled to a third node, and the sense resistance may be coupled between the third node and ground.

The steering circuit may also include a second plurality of switches, with each switch of the second plurality thereof being coupled between the input terminal and the output terminal of a different one of the plurality of laser emitters.

The first plurality of switches and second plurality of switches may be operated so that a switch of the first plurality of switches coupled to an input terminal of a currently selected one of the plurality of laser emitters is closed while the currently selected one of the plurality of laser emitters is selected and so that a switch of the second plurality of switches coupled between an input terminal and output terminal of the currently selected one of the plurality of laser emitters is opened while the currently selected one of the plurality of laser emitters is selected. The first plurality of switches and second plurality of switches may be operated so that switches of the first plurality of switches coupled to input terminals of non-selected ones of the plurality of laser emitters are opened while the non-selected ones of the plurality of laser emitters remain non-selected, and so that switches of the second plurality of switches coupled to the input terminals and to output terminals of the non-selected ones of the plurality of laser emitters are closed while the non-selected ones of the plurality of laser emitters remain non-selected. The current sensing circuit may also include a comparator having an inverting terminal coupled to the sense resistance, a non-inverting terminal coupled to a reference voltage, and an output generating the laser drive signal.

The current sensing circuit may also include a current source providing a reference current to a reference resistor, and the reference voltage may be produced at a node coupling the current source to the reference resistor.

The steering circuit may select non-physically adjacent ones of the plurality of laser emitters during successive time periods.

The laser driver may include a DC-DC converter.

The electronic device may also include a plurality of reflected light detectors each being respectively paired to one of the plurality of laser emitters, each reflected light detector configured to detect light emitted by its respective paired one of the plurality of laser emitters that has reflected off a target and returned to impinge upon that reflected light detector.

Another aspect described herein is an electronic device including a laser driver configured to generate a laser drive signal based upon a feedback control signal, a steering circuit configured to selectively steer the laser drive signal to a different selected one of a plurality of outputs and prevent the laser drive signal from being steered to non-selected ones of the plurality of outputs, during each of a plurality of time periods, and control circuitry configured to sense a magnitude of a current of the laser drive signal and to generate the feedback control signal based thereupon, the feedback control signal being generated so as to cause the laser driver to generate the laser drive signal as having a current with a substantially constant magnitude.

The control circuitry may include a sense resistance coupled between the laser driver and steering circuit, and a current sensing circuit configured to generate and adjust the laser drive signal as a function of a sense voltage formed across the sense resistance when the laser drive signal flows through the sense resistance.

The current sensing circuit may be configured to compare the sense voltage to a reference voltage and to generate and adjust the laser drive signal based upon the comparison.

The steering circuit may include a first plurality of switches, with each switch of the first plurality thereof being coupled between a different one of the plurality of outputs and a first node.

The sense resistance may be a sense resistor.

The steering circuit may select non-physically adjacent ones of the plurality of outputs during successive time periods.

The laser driver may be a DC-DC converter.

A method aspect disclosed herein includes generating a laser drive signal, selectively steering the laser drive signal to a different selected one of a plurality of laser emitters that does not have an immediately adjacent field of view to an immediately previously selected one of the plurality of laser emitters while preventing the laser drive signal from being steered to non-selected ones of the plurality of laser emitters during each of a plurality of time periods, sensing a magnitude of a current of the laser drive signal, and adjusting the generation of the laser drive signal based upon the sensed magnitude so that the current of the laser drive signal has a substantially constant magnitude.

The magnitude of the current of the laser drive signal may be sensed by measuring a voltage drop across a sense resistor that results from the laser drive signal flowing through the sense resistor.

The generation of the laser drive signal may be adjusted based upon a comparison of the voltage drop across the sense resistor to a reference voltage.

Also disclosed herein is an electronic device including a plurality of laser emitters, a laser driver configured to generate a laser drive signal based upon a feedback control signal, a steering circuit configured to selectively steer the laser drive signal to a different one of the plurality of laser emitters, during each of a plurality of time periods, and control circuitry. The control circuitry is configured to sense the laser drive signal and, based on the sensed laser drive signal, generate a feedback control signal so as to cause the laser driver to generate the laser drive signal as having a current with a substantially constant magnitude.

The plurality of laser emitters may each have a different field of view. In addition, the steering circuit may select ones of the plurality of laser emitters that do not have immediately adjacent fields of view during successive time periods.

The plurality of laser emitters may be coupled between the steering circuit and ground. In addition, the control circuitry may include a sense resistance coupled between the laser driver and steering circuit, and a current sensing circuit configured to generate and adjust the laser drive signal as a function of a sense voltage formed across the sense resistance when the laser drive signal flows through the sense resistance. The current sensing circuit may be configured to compare the sense voltage to a reference voltage and to generate and adjust the laser drive signal based upon the comparison.

The plurality of laser emitters may be coupled between the laser driver and the current sensing circuit. In addition, the control circuitry may include a sense resistance coupled between the plurality of laser emitters and ground, and a current sensing circuit configured to generate and adjust the laser drive signal as a function of a sense voltage formed across the sense resistance when current flows through one of the plurality of laser emitters. The current sensing circuit may be configured to compare the sense voltage to a reference voltage and to generate and adjust the laser drive signal based upon the comparison.

The current sensing circuit may include a comparator having an inverting terminal coupled to the sense resistance, a non-inverting terminal coupled to a reference voltage, and an output generating the laser drive signal. The current sensing circuit may also include a current source providing a reference current to a reference resistor, and the reference voltage may be produced at a node coupling the current source to the reference resistor.

Also disclosed herein is an electronic device including a laser driver configured to generate a laser drive signal based upon a feedback control signal, a steering circuit configured to selectively steer the laser drive signal to different selected non-physically adjacent ones of a plurality of outputs and prevent the laser drive signal from being steered to non-selected ones of the plurality of outputs, during each of a plurality of successive time periods, and control circuitry configured to generate the feedback control signal so as to cause the laser driver to generate the laser drive signal as having a current with a substantially constant magnitude.

The control circuitry may include a sense resistance coupled between the laser driver and steering circuit, and a current sensing circuit configured to generate and adjust the laser drive signal as a function of a sense voltage formed across the sense resistance when the laser drive signal flows through the sense resistance.

The current sensing circuit may be configured to compare the sense voltage to a reference voltage and to generate and adjust the laser drive signal based upon the comparison.

The steering circuit may be a first plurality of switches, with each switch of the first plurality thereof being coupled to a different one of the plurality of outputs.

BRIEF DESCRIPTION OF THE DRAWINGS

FIGS. 5A and 5B are timing diagrams of the operation of the switches of FIG. 4 in first and second phases.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
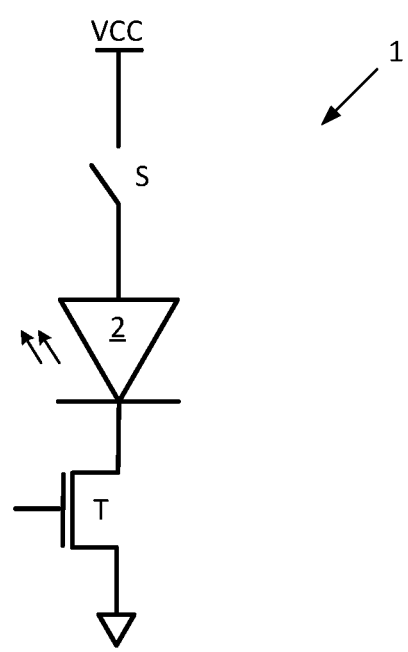
FIG. 1 is a schematic diagram of a prior art laser driver.
Figure 2A:
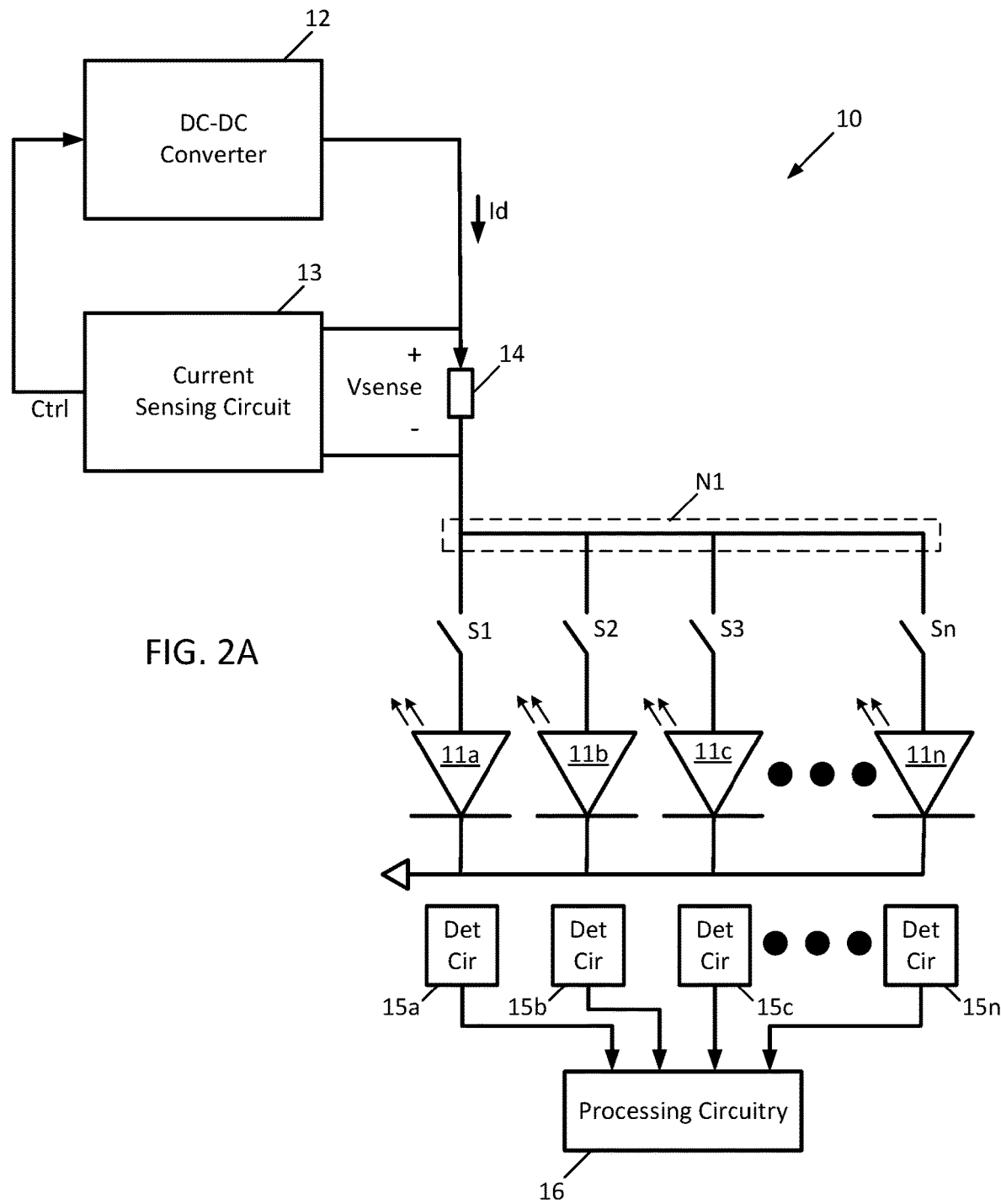
FIG. 2A is a schematic block diagram of a first embodiment of laser driver disclosed herein.

A voltage controlled, steered, laser driver circuit 10 for operating laser diodes is now described with reference to FIG. 2A. The laser driver circuit 10 is configured for operating laser diodes 11a, . . . , 11n, with n being any integer. The laser diodes 11a, . . . , 11n in this example are arranged such that they each have a different non-overlapping field of view, although in some cases, the fields of view of the laser diodes 11a, . . . , 11n may overlap. The cathodes of the laser diodes 11a, . . . , 11n are connected to a ground node. The anodes of the laser diodes 11a, . . . , 11n are connected by respective switches S1, . . . , Sn to a common node N1. Respective returned photon detection circuits 15a, . . . , 15n are paired to the laser diodes 11a, . . . , 11n and provide output to processing circuitry 16.

A DC-DC converter 12 has an output coupled through a sense resistance 14 (e.g., one or more sense resistors) to the common node N1. A current sensing circuit 13 has first and second inputs respectively connected to opposite terminals of the sense resistance 14, and an output connected to the input of the DC-DC converter 12. In an alternate application, the DC-DC converter 12 may not be present, and instead a charge pump circuit 12' may be used in place of the DC-DC converter, as shown in FIG. 2C.

Referring back to FIG. 2A, in operation, the DC-DC converter 12 generates a drive current Id at its output. As the drive current Id flows through the sense resistance 14 and into the common node N1, a voltage drop Vsense occurs across the sense resistance 14. The current sensing circuit 13 generates the control signal Ctrl based upon sense voltage Vsense, and the control signal Ctrl serves as feedback to the DC-DC converter 12 to cause the DC-DC converter 12 to maintain the drive current Id as having a substantially constant magnitude (i.e., a magnitude that does not vary by more than a few percent).

The switches S1, . . . , Sn serve to steer the drive current Id to one of the laser diodes 11a, . . . , 11n at a time. A closed switch S1, . . . , Sn delivers the drive current Id to its respective laser diode 11a, . . . , 11n so that the laser diode lases for a prescribed period. Photons that are emitted by a laser diode 11a, . . . , 11n and reflect off an object to return to the associated returned photon detection circuit 15a, . . . , 15n for that laser diode 11a, . . . , 11n are detected by the photon detection circuit 15a, . . . , 15n and reported to the processing circuitry 16. The processing circuitry 16 in turn analyzes the reported photon detections to determine the distance to the object that the photons reflected from. Since the speed of light is known, from the elapsed time between photon emission and photon detection, the distance to the object can be precisely calculated.

At any given time, one of the switches S1, . . . , Sn will be closed while the remainder of the switches S1, . . . , Sn will be open. It is desired for physically adjacent ones of the laser diodes 11a, . . . , 11n to not sequentially lase so that photons emitted by one laser diode 11a, . . . , 11n do not reflect off an object and return to impinge upon a returned photon detection circuit 15a, . . . , 15n associated with a laser diode 11a, . . . , 11n adjacent to the laser diode 11a, . . . , 11n which emitted those photons.

This concern is perhaps best illustrated with an example. Returned photon detection circuit 15a is "paired" to laser diode 11a such that it is intended to receive photons emitted by the laser diode 11a that reflect off an object and return. Similarly, photon detection circuit 15b is paired to laser diode 11b such that it is intended to receive photons emitted by the laser diode 11b that reflect off an object and return. When laser diode 11a is activated, returned photon detection circuit 15a is activated to receive emitted photons that reflect off an object and return. Likewise, when laser diode 11b is activated, returned photon detection circuit 15b is activated to receive emitted photons that reflect off an object and return.

Therefore, the switches S1, . . . , Sn are actuated in a pattern such that the laser diodes 11a, . . . , 11n are not sequentially actuated, with "sequential" referring to physically adjacent laser diodes. To refer this to the specific example of laser diode 11a and laser diode 11b, so as to avoid a situation where photons emitted by laser diode 11b reflect off an object and return to impinge upon the returned photon detection circuit 15a while it is still detecting, laser diode 11b is not activated immediately after laser diode 11a is activated in the sequence of activation, and instead one of the laser diodes that it not physically adjacent to laser diode 11a is activated immediately after laser diode 11a is activated in the sequence of activation.

One laser diode 11a, ..., 11n is considered "adjacent" to another laser diode when it is the physically closest laser diode 11a, ..., 11n to the other laser diode in a given spatial direction. As an example, assume that the physical layout of the laser diodes 11a, ..., 11n shown in FIG. 2A matches the illustrated schematic layout; therefore, laser diodes 11a and 11c would both be adjacent to laser diode 11b, but laser diode 11n would not be adjacent to laser diode 11b.

Through the use of the non-adjacent sequential actuation pattern for the switches S1, ..., Sn, the above discussed photon cross-contamination scenarios are averted, and through the regulation provided by the current sensing circuit 13, the drive current Id is kept with a substantially constant current over operating conditions as it is steered to different laser diodes 11a, ..., 11n for ranging operations.

Figure 2B:
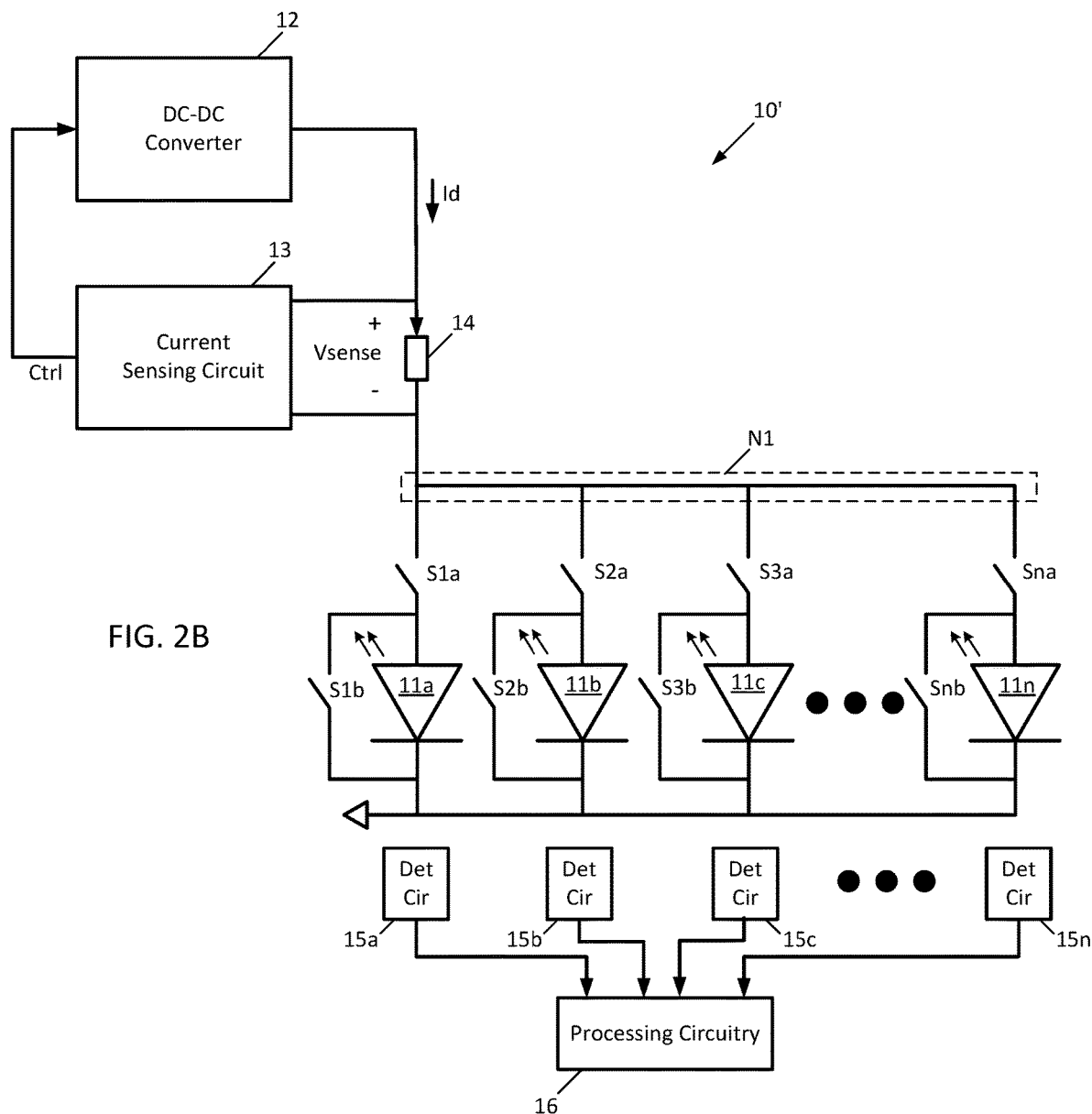
FIG. 2B is a schematic block diagram of a variant of the first embodiment of laser driver disclosed herein.
Figure 2C:
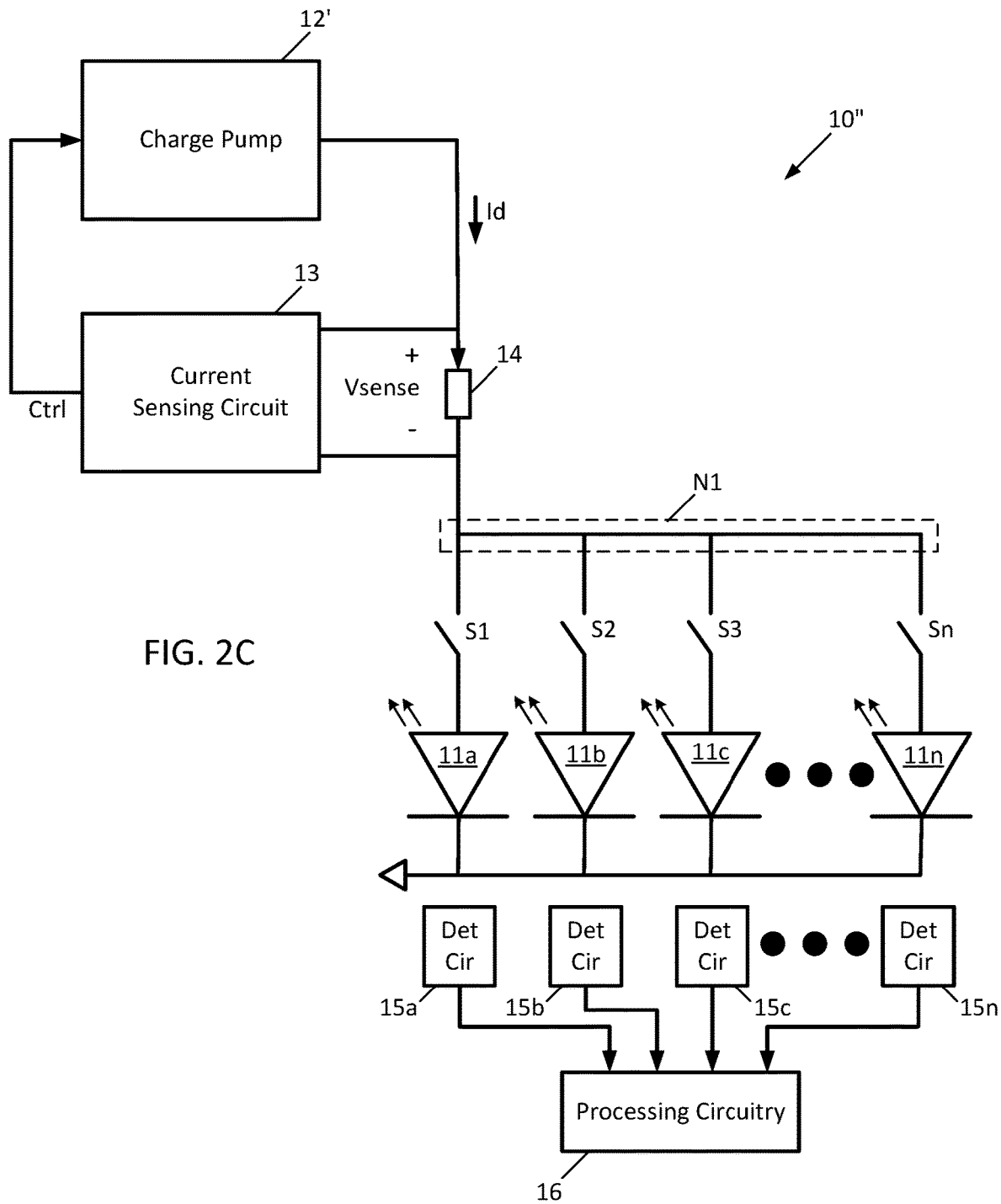
FIG. 2C is a schematic block diagram of another variant of the first embodiment of laser driver disclosed herein.

A variant of the laser driver circuit 10' is shown in FIG. 2B. Note that in this example, switches S1a, ..., Sna selectively connect the anodes of the laser diodes 11a, ..., 11n to the common node N1, while switches S1b, ..., Snb selectively short the anodes and cathodes of the laser diodes 11a, ..., 11n. The operation between switches S1a, ..., Sna and S1b, ..., Snb is coordinated so that, for example, switch S1b is open while switch S1a is closed and so that switch S1b is closed while switch S1a is open. Similarly, switch S2b is open while switch S2a is closed and switch S2b is closed while switch S2a is open. Likewise, switch S3b is open while switch S3a is closed and switch S3b is closed while switch 32a is open. Also, switch Snb is open while switch Sna is closed and switch Snb is closed while switch Sna is open. Consequently, notice that at any given time during operation, only one of switches S1a, ..., Sna is closed yet all but one of switches S1b, ..., Snb are closed.

Figure 3A:
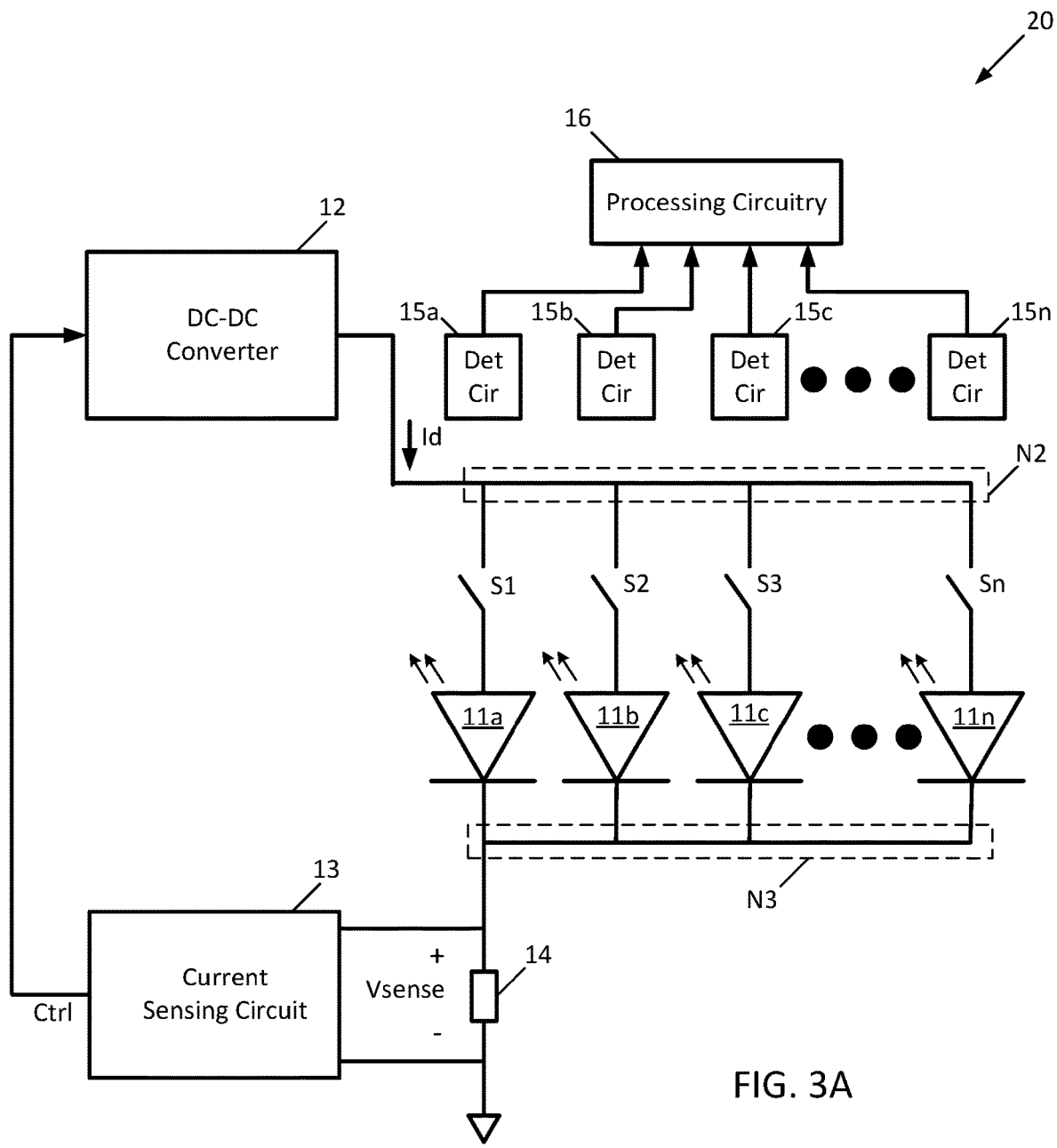
FIG. 3A is a schematic block diagram of a second embodiment of laser driver disclosed herein.

Another embodiment of laser driver circuit 20 is shown in FIG. 3A. In this embodiment, the output of the DC-DC converter 12 is directly fed to a common node N2, and the common node is selectively connected to the anodes of the laser diodes 11a, ..., 11n via switches S1, ..., Sn. The activation of the switches S1, ..., Sn has been described above. Also in this embodiment, the cathodes of the laser diodes 11a, ..., 11n are connected to a common node N3, and the sense resistance 14 is connected between the common node N3 and ground. Therefore, instead of being high-side driven like the laser driver circuits 10, 10' described above, the laser driver circuit 20 is low-side driven. Operation of the current sensing circuit 13 and DC-DC converter 12 remains the same as described above.

Figure 3B:
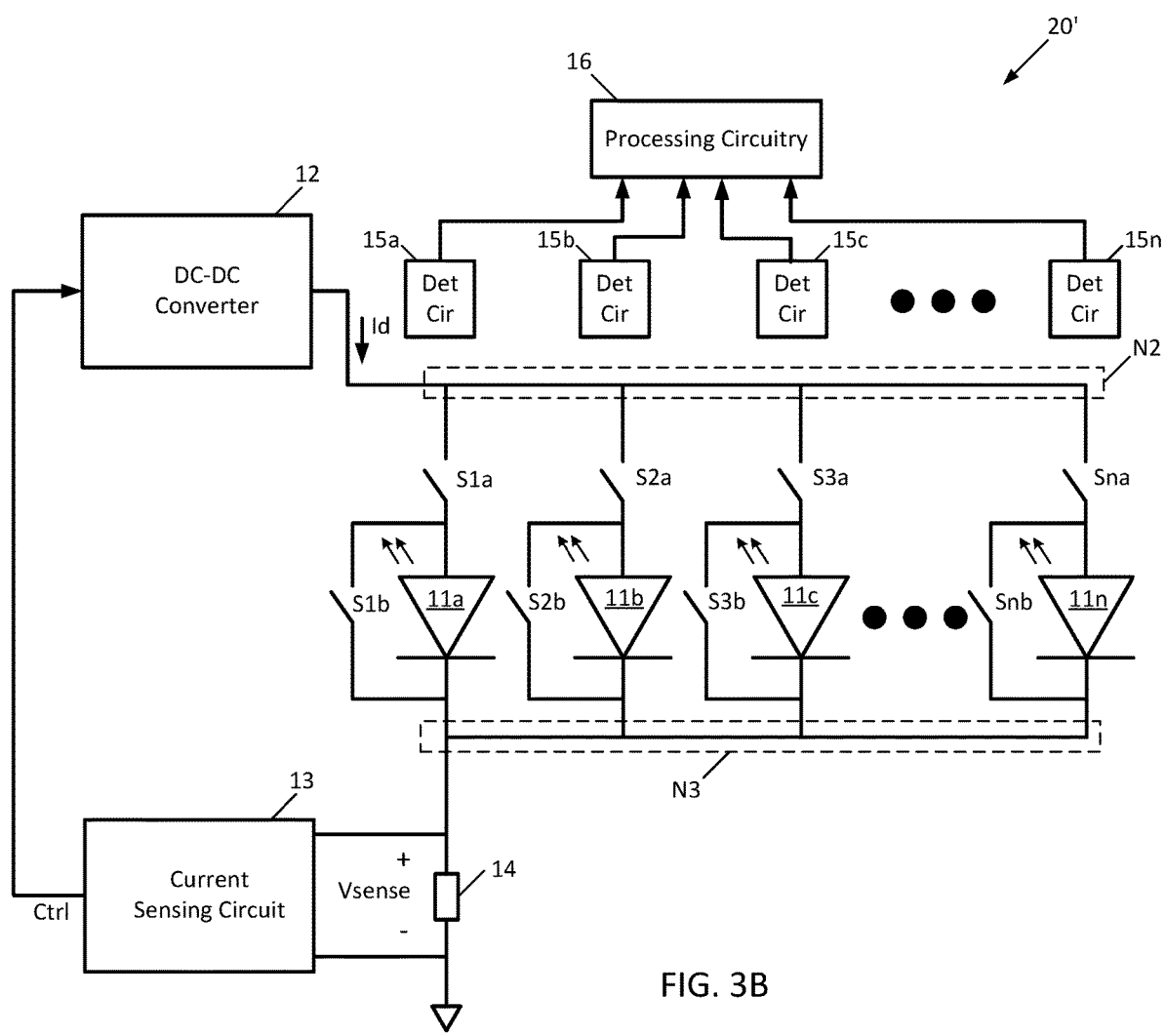
FIG. 3B is a schematic block diagram of a variant of the second embodiment of laser driver disclosed herein.

A variant of the laser driver circuit 20' is shown in FIG. 3B. In this example, switches S1a, ..., Sna selectively connect the anodes of the laser diodes 11a, ..., 11n to the common node N2, while switches S1b, ..., Snb selectively short the anodes and cathodes of the laser diodes 11a, ..., 11n. As described above, the operation between switches S1a, ..., Sna and S1b, ..., Snb is coordinated so that, for example, switch S1b is open while switch S1a is closed and so that switch S1b is closed while switch S1a is open. Similarly, switch S2b is open while switch S2a is closed and switch S2b is closed while switch S2a is open. Likewise, switch S3b is open while switch S3a is closed and switch S3b is closed while switch 32a is open. Also, switch Snb is open while switch Sna is closed and switch Snb is closed while switch Sna is open. Consequently, at any given time during operation, only one of switches S1a, ..., Sna is closed yet all but one of switches S1b, ..., Snb are closed.

It should be appreciated that in the examples given above, each laser diodes 11a, ..., 11n may actually represent a laser diode array that is driven by the drive current Id. In addition, the laser diodes 11a, ..., 11n may be any suitable laser diodes or collimated light generators, such as vertical-cavity surface-emitting lasers (VCSELs). The returned photon detection circuits 15a, ..., 15n may be of any suitable type (for example, signal photon avalanche diodes (SPADs)). Likewise, the DC-DC converter 12 may be of any suitable type, such as a charge pump circuit. Similarly, the current sensing circuit 13 may be of any suitable type.

Figure 4:
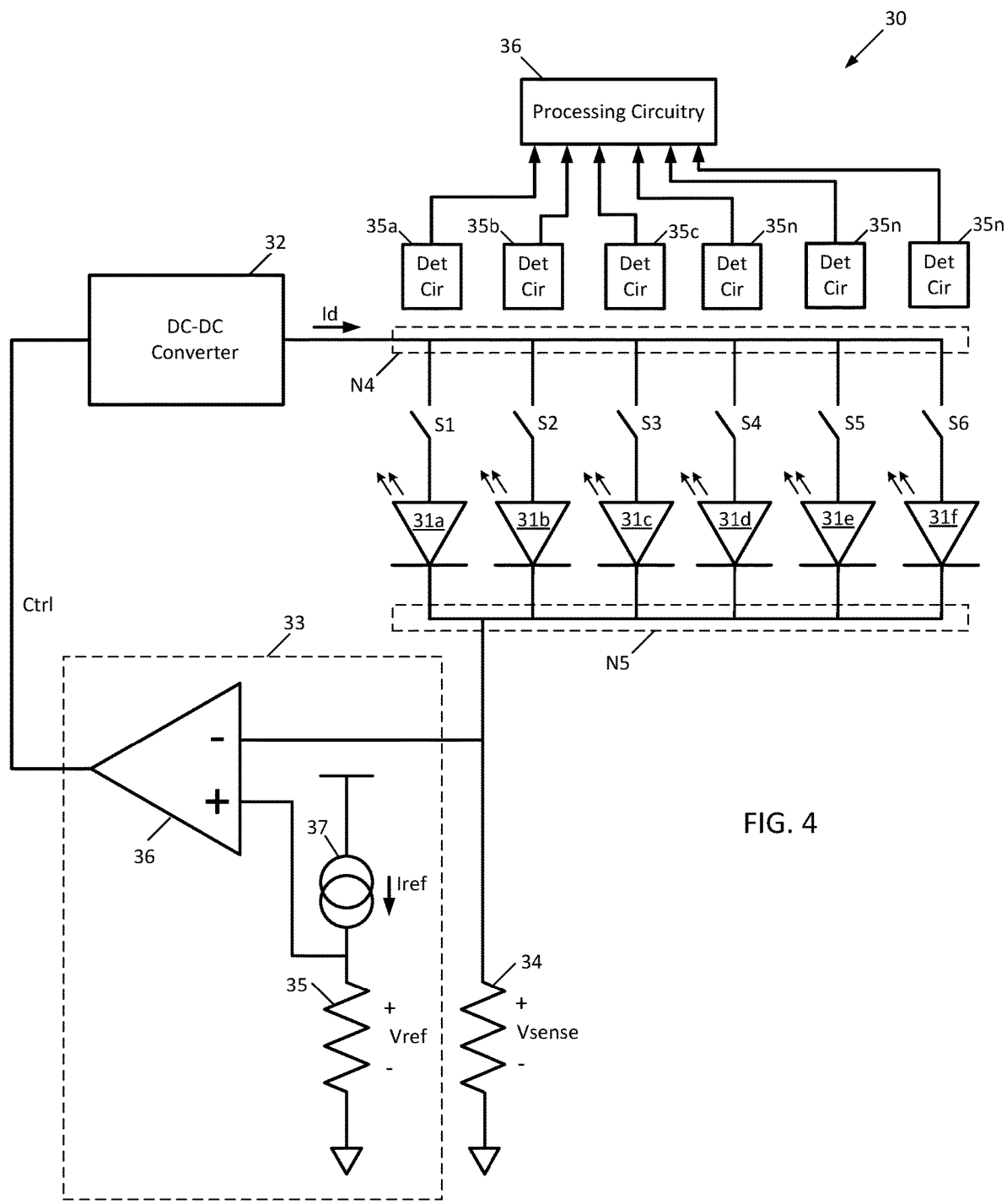
FIG. 4 is a schematic diagram of a specific implementation of the second embodiment of laser driver disclosed herein.

A specific implementation example of laser driver circuit 30 for operating laser diodes is now described with reference to FIG. 4. The laser driver circuit 30 operates VCSELs 31a-31f. The VCSELs 31a-31f are arranged such that they each have a different non-overlapping field of view. The cathodes of the VCSELs 31a-31f are connected to common node N5. The anodes of the VCSELs 31a-31f are connected by respective switches S1-S6 to a common node N4. Respective returned photon detection circuits 35a, ..., 35n are paired to the VCSELs 31a-31f and provide output to processing circuitry 36.

A DC-DC converter 32 has an output connected to the common node N4. A sense resistor 34 is connected between the common node N5 and ground. A current sensing circuit 33 includes a comparator 36 having its inverting terminal connected to the common node N5, and its non-inverting terminal connected to a reference voltage Vref. The reference voltage Vref is generated via a current source 37 sourcing a reference current Iref to a reference resistor 35, and the reference voltage Vref is the voltage drop across the reference resistor 35.

In operation, the DC-DC converter 32 generates the drive current Id at its output. The switches S1-S6 serve to steer the drive current Id to one of the VCSELs 31a-31f at a time. A closed switch S1-S6 delivers the drive current Id to its respective VCSELs 31a-31f so that the VCSEL lases for a prescribed period. Photons that are emitted by a VCSELs 31a-31f and reflect off an object to return to the associated returned photon detection circuit 35a, ..., 35n for that VCSELs 31a-31f are detected by the photon detection circuit 35a, ..., 35n and reported to the processing circuitry 36. The processing circuitry 36 in turn analyzes the reported photon detections to determine the distance to the object that the photons reflected from. Since the speed of light is known, from the elapsed time between photon emission and photon detection, the distance to the object can be precisely calculated.

At any given time, one of the switches S1-S6 will be closed while the remainder of the switches S1-S6 will be open. This sequence will be described in detail below.

After the drive current Id flows through one of the VCSELs 31a-31f and into the common node N5, it flows through a sense resistor 34 to ground. This generates a sense voltage Vsense across the sense resistor. The comparator 36 compares the sense voltage Vsense to the reference voltage Vref, and when the sense voltage Vsense falls below the reference voltage Vref, the comparator 36 asserts its output and therefore the control signal Ctrl. Assertion of the control signal Ctrl signals to the DC-DC converter 32 to increase the magnitude of the drive current Id. Once the sense voltage Vsense becomes equal to the reference voltage Vref, the control signal Ctrl will be deasserted by the comparator 36, and the magnitude of the drive current Id will be maintained.

The order of the opening and closing of the switches S1-S6 proceeds in two phases. In the first phase, in sequence, switches S1, S3, and S5 are closed. This can be seen in the timing diagram of FIG. 5A in which between times T0-T1, switch S1 is closed (in this timing diagram, when a trace labeled with a switch designation is shown as high, this means that switch is closed, and when a trace labeled with a switch designation is shown as low, this means that that switch is closed) while switches S2-S6 are open. Between times T1-T2, switch S3 is closed while switches S1-S2, S4-S6 are open. Between times T2-T3. switch S5 is closed while switches S1-S4, S6 are open.

In the second phase, in sequence, switches S2, S4, and S6 are closed. This can be seen in the timing diagram of FIG. 5B in which between times T4-T5, switch S2 is closed while switches S1, S3-S6 are open. Between times T5-T6, switch S4 is closed while switches S1-S3, S5-S6 are open. Between times T6-T7, switch S6 is closed while switches S1-S5 are open.

Therefore, overall, the order of the closing and opening of the switches S1-S6 is: S1, S3, S5, S2, S4, and S6, with only one switch being closed at a time and with the other switches being open while one switch is closed.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A time of flight ranging system, comprising:
a plurality of laser emitters each configured to, when activated by a laser drive signal, emit laser photons;
a laser driver configured to generate the laser drive signal based upon a feedback control signal;
a steering circuit configured to selectively steer the laser drive signal to a different selected one of the plurality of laser emitters and prevent the laser drive signal from being steered to non-selected ones of the plurality of laser emitters, during each time period of a plurality of time periods;
control circuitry configured to sense a magnitude of a current of the laser drive signal and to generate the feedback control signal based thereupon, the feedback control signal being generated so as to cause the laser driver to generate the laser drive signal as having a current with a substantially constant magnitude;
a photon detection circuit configured to detect those of the laser photons that have reflected off an object within a field of view of the selected one of the plurality of laser emitters; and
processing circuitry configured to determine a distance to the object based upon an elapsed time between emission of the laser photons and detection of the laser photons after reflection off the object.

2. The time of flight ranging system of claim 1, wherein the plurality of laser emitters are carried within the time of flight ranging system such that each of the plurality of laser emitters has a different field of view; and wherein the steering circuit selects ones of the plurality of laser emitters that do not have immediately adjacent fields of view during successive time periods.

3. The time of flight ranging system of claim 1,
wherein the plurality of laser emitters are coupled between the steering circuit and ground; and wherein the control circuitry comprises:
a sense resistance coupled between the laser driver and steering circuit; and
a current sensing circuit configured to generate and adjust the feedback control signal as a function of a sense voltage formed across the sense resistance when the laser drive signal flows through the sense resistance.

4. The time of flight ranging system of claim 3, wherein the current sensing circuit is configured to compare the sense voltage to a reference voltage and to generate and adjust the laser drive signal based upon the comparison.

5. The time of flight ranging system of claim 3,
wherein the steering circuit comprises a first plurality of switches, each switch of the first plurality of switches thereof being coupled between an input terminal of a different one of the plurality of laser emitters and a first node; and
wherein each of the plurality of laser emitters has an output terminal coupled to ground.

6. The time of flight ranging system of claim 5, wherein the steering circuit further comprises a second plurality of switches, each switch of the second plurality of switches being coupled between the input terminal and the output terminal of a different one of the plurality of laser emitters; wherein the first plurality of switches and second plurality of switches are operated so that a switch of the first plurality of switches coupled to an input terminal of a currently selected one of the plurality of laser emitters is closed while the currently selected one of the plurality of laser emitters is selected and so that a switch of the second plurality of switches coupled between an input terminal and output terminal of the currently selected one of the plurality of laser emitters is opened while the currently selected one of the plurality of laser emitters is selected; and wherein the first plurality of switches and second plurality of switches are operated so that switches of the first plurality of switches coupled to input terminals of non-selected ones of the plurality of laser emitters are opened while the non-selected ones of the plurality of laser emitters remain non-selected, and so that switches of the second plurality of switches coupled to the input terminals and to output terminals of the non-selected ones of the plurality of laser emitters are closed while the non-selected ones of the plurality of laser emitters remain non-selected.

7. The time of flight ranging system of claim 3, wherein the sense resistance comprises a sense resistor.

8. The time of flight ranging system of claim 1,
wherein the plurality of laser emitters are coupled between the steering circuit and the control circuitry; and
wherein the control circuitry comprises:
a sense resistance coupled between the plurality of laser emitters and ground; and
a current sensing circuit configured to generate and adjust the laser drive signal as a function of a sense voltage formed across the sense resistance when the laser drive signal flows through a currently selected one of the plurality of laser emitters and through the sense resistance.

9. The time of flight ranging system of claim 8, wherein the current sensing circuit is configured to compare the sense voltage to a reference voltage and to generate and adjust the laser drive signal based upon the comparison.

10. The time of flight ranging system of claim 8,
wherein the steering circuit comprises a first plurality of switches, each switch of the first plurality of switches being coupled between an input terminal of a different one of the plurality of laser emitters and a second node;
wherein each of the plurality of laser emitters has an output terminal coupled to a third node; and
wherein the sense resistance is coupled between the third node and ground.

11. The time of flight ranging system of claim 10, wherein the steering circuit further comprises a second plurality of switches, each switch of the second plurality of switches being coupled between the input terminal and the output terminal of a different one of the plurality of laser emitters; wherein the first plurality of switches and second plurality of switches are operated so that a switch of the first plurality of switches coupled to an input terminal of a currently selected one of the plurality of laser emitters is closed while the currently selected one of the plurality of laser emitters is selected and so that a switch of the second plurality of switches coupled between an input terminal and output terminal of the currently selected one of the plurality of laser emitters is opened while the currently selected one of the plurality of laser emitters is selected; and wherein the first plurality of switches and second plurality of switches are operated so that switches of the first plurality of switches coupled to input terminals of non-selected ones of the plurality of laser emitters are opened while the non-selected ones of the plurality of laser emitters remain non-selected, and so that switches of the second plurality of switches coupled to the input terminals and to output terminals of the non-selected ones of the plurality of laser emitters are closed while the non-selected ones of the plurality of laser emitters remain non-selected.

12. The time of flight ranging system of claim 8, wherein the current sensing circuit comprises:
a comparator having an inverting terminal coupled to the sense resistance, a non-inverting terminal coupled to a reference voltage, and an output generating the laser drive signal.

13. The time of flight ranging system of claim 12, wherein the current sensing circuit further comprises a current source providing a reference current to a reference resistor, and wherein the reference voltage is produced at a node coupling the current source to the reference resistor.

14. The time of flight ranging system of claim 1, wherein the steering circuit selects non-physically adjacent ones of the plurality of laser emitters during successive time periods.

15. The time of flight ranging system of claim 1, wherein the laser driver comprises a DC-DC converter.

16. The time of flight ranging system of claim 1, further comprising a plurality of reflected light detectors each being respectively paired to one of the plurality of laser emitters, each reflected light detector configured to detect light emitted by its respective paired one of the plurality of laser emitters that has reflected off a target and returned to impinge upon that reflected light detector.

17. A time of flight ranging system, comprising:
a laser driver configured to generate a laser drive signal based upon a feedback control signal;
a steering circuit configured to selectively steer the laser drive signal to a different selected one of a plurality of outputs and prevent the laser drive signal from being steered to non-selected ones of the plurality of outputs, during each of a plurality of time periods;
control circuitry configured to sense a magnitude of a current of the laser drive signal and to generate the feedback control signal based thereupon, the feedback control signal being generated so as to cause the laser driver to generate the laser drive signal as having a current with a substantially constant magnitude; and
processing circuitry configured to determine a distance to an object based upon an elapsed time between emission of laser photons from a laser emitter activated by the laser drive signal steered to the selected one of the plurality of outputs and detection of the laser photons after having reflected off the object.

18. The time of flight ranging system of claim 17,
wherein the control circuitry comprises:
a sense resistance coupled between the laser driver and steering circuit; and
a current sensing circuit configured to generate and adjust the feedback control signal as a function of a sense voltage formed across the sense resistance when the laser drive signal flows through the sense resistance.

19. The time of flight ranging system of claim 18, wherein the current sensing circuit is configured to compare the sense voltage to a reference voltage and to generate and adjust the laser drive signal based upon the comparison.

20. The time of flight ranging system of claim 18, wherein the steering circuit comprises a first plurality of switches, each switch of the first plurality of switches being coupled between a different one of the plurality of outputs and a first node.

21. The time of flight ranging system of claim 18, wherein the sense resistance comprises a sense resistor.

22. The time of flight ranging system of claim 17, wherein the steering circuit selects non-physically adjacent ones of the plurality of outputs during successive time periods.

23. The time of flight ranging system of claim 17, wherein the laser driver comprises a DC-DC converter.

24. A method of operating a time of flight ranging system, comprising:
generating a laser drive signal;
selectively steering the laser drive signal to a different selected one of a plurality of laser emitters that does not have an immediately adjacent field of view to an immediately previously selected one of the plurality of laser emitters, while preventing the laser drive signal from being steered to non-selected ones of the plurality of laser emitters, during each of a plurality of time periods, each laser emitter configured to, when activated by the laser drive signal, emit laser photons;
sensing a magnitude of a current of the laser drive signal;
adjusting the generation of the laser drive signal based upon the sensed magnitude so that the current of the laser drive signal has a substantially constant magnitude; and
determining a distance to an object within the field of view of the selected one of the plurality of laser emitters based upon an elapsed time between emission of the laser photons from the selected one of the plurality of laser emitters and detection of the laser photons after having reflected off the object.

25. The method of claim 24, wherein the magnitude of the current of the laser drive signal is sensed by measuring a voltage drop across a sense resistor that results from the laser drive signal flowing through the sense resistor.

26. The method of claim 25, wherein the generation of the laser drive signal is adjusted based upon a comparison of the voltage drop across the sense resistor to a reference voltage.

27. A time of flight ranging system, comprising:
- a plurality of laser emitters each configured to, when activated by a laser drive signal, emit laser photons;
- a laser driver configured to generate the laser drive signal based upon a feedback control signal;
- a steering circuit configured to selectively steer the laser drive signal to a different one of the plurality of laser emitters, during each of a plurality of time periods;
- control circuitry configured to sense the laser drive signal and, based on the sensed laser drive signal, generate a feedback control signal so as to cause the laser driver to generate the laser drive signal as having a current with a substantially constant magnitude;
- a photon detection circuit configured to detect laser photons that have reflected off an object within a field of view of an activated one of the plurality of laser emitters; and
- processing circuitry configured to determine a distance to the object based upon an elapsed time between emission of the laser photons and detection of the laser photons after reflection off the object.

28. The time of flight ranging system of claim 27, wherein the plurality of laser emitters each have a different field of view; and wherein the steering circuit selects ones of the plurality of laser emitters that do not have immediately adjacent fields of view during successive time periods.

29. The time of flight ranging system of claim 27,
- wherein the plurality of laser emitters are coupled between the steering circuit and ground;
- wherein the control circuitry comprises:
  - a sense resistance coupled between the laser driver and steering circuit; and
  - a current sensing circuit configured to generate and adjust the laser drive signal as a function of a sense voltage formed across the sense resistance when the laser drive signal flows through the sense resistance; and
- wherein the current sensing circuit is configured to compare the sense voltage to a reference voltage and to generate and adjust the laser drive signal based upon the comparison.

30. The time of flight ranging system of claim 27,
- wherein the plurality of laser emitters are coupled between the laser driver and the current sensing circuit;
- wherein the control circuitry comprises:
  - a sense resistance coupled between the plurality of laser emitters and ground; and
  - a current sensing circuit configured to generate and adjust the laser drive signal as a function of a sense voltage formed across the sense resistance when current flows through one of the plurality of laser emitters; and
- wherein the current sensing circuit is configured to compare the sense voltage to a reference voltage and to generate and adjust the laser drive signal based upon the comparison.

31. The time of flight ranging system of claim 30, wherein the current sensing circuit comprises:
- a comparator having an inverting terminal coupled to the sense resistance, a non-inverting terminal coupled to a reference voltage, and an output generating the laser drive signal; and
- a current source providing a reference current to a reference resistor, and wherein the reference voltage is produced at a node coupling the current source to the reference resistor.

32. A time of flight ranging system, comprising:
- a laser driver configured to generate a laser drive signal based upon a feedback control signal;
- a steering circuit configured to selectively steer the laser drive signal to different selected non-physically adjacent ones of a plurality of outputs and prevent the laser drive signal from being steered to non-selected ones of the plurality of outputs, during each of a plurality of successive time periods;
- control circuitry configured to generate the feedback control signal so as to cause the laser driver to generate the laser drive signal as having a current with a substantially constant magnitude; and
- processing circuitry configured to determine a distance to an object based upon an elapsed time between emission of laser photons from a laser emitter activated by the laser drive signal steered to the selected one of the plurality of outputs and detection of the laser photons after having reflected off the object.

33. The time of flight ranging system of claim 32,
- wherein the control circuitry comprises:
  - a sense resistance coupled between the laser driver and steering circuit; and
  - a current sensing circuit configured to generate and adjust the laser drive signal as a function of a sense voltage formed across the sense resistance when the laser drive signal flows through the sense resistance.

34. The time of flight ranging system of claim 33, wherein the current sensing circuit is configured to compare the sense voltage to a reference voltage and to generate and adjust the laser drive signal based upon the comparison.

35. The time of flight ranging system of claim 32,
- wherein the steering circuit comprises a first plurality of switches, each switch of the first plurality of switches being coupled to a different one of the plurality of outputs.

* * * * *